(12) United States Patent
Usui et al.

(10) Patent No.: US 7,405,484 B2
(45) Date of Patent: Jul. 29, 2008

(54) SEMICONDUCTOR DEVICE CONTAINING STACKED SEMICONDUCTOR CHIPS AND MANUFACTURING METHOD THEREOF

(75) Inventors: Ryosuke Usui, Ichinomiya (JP); Hideki Mizuhara, Bisai (JP); Takeshi Nakamura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 167 days.

(21) Appl. No.: 10/951,541

(22) Filed: Sep. 28, 2004

(65) Prior Publication Data

US 2005/0067686 A1    Mar. 31, 2005

(30) Foreign Application Priority Data

Sep. 30, 2003    (JP)    ............... 2003-339123

(51) Int. Cl.
*H01L 23/48* (2006.01)
(52) U.S. Cl. .............. 257/776; 257/753; 257/780; 257/781; 257/E21.143; 257/E21.218; 257/E21.311
(58) Field of Classification Search .......... 257/E21.143, 257/E21.218, E21.311; 438/9, 64, 485, 658, 438/709, 710, 729, 788, 792, 798, FOR. 117, 438/FOR. 448
See application file for complete search history.

(56) References Cited

U.S. PATENT DOCUMENTS

| 3,918,149 | A | * | 11/1975 | Roberts | ...................... 438/657 |
| 4,908,094 | A | * | 3/1990 | Jones et al. | ................... 216/34 |
| 5,485,038 | A | * | 1/1996 | Licari et al. | ................. 257/758 |
| 6,046,500 | A | * | 4/2000 | Fey et al. | .................... 257/729 |
| 6,593,658 | B2 | * | 7/2003 | Huang et al. | ................ 257/773 |
| 6,828,604 | B2 | | 12/2004 | Inoue | |
| 6,853,060 | B1 | * | 2/2005 | Seok et al. | ................... 257/678 |
| 6,921,860 | B2 | * | 7/2005 | Peterson et al. | ............ 174/52.2 |
| 6,936,927 | B2 | * | 8/2005 | Igarashi et al. | .............. 257/775 |

FOREIGN PATENT DOCUMENTS

| JP | 07-183426 | 7/1995 |
| JP | 2000-039451 | 2/2000 |
| JP | 2000-216297 | 8/2000 |
| JP | 2002-270640 | 9/2002 |
| JP | 2002-334880 | 11/2002 |
| KR | 2002-85803 | 11/2002 |

* cited by examiner

*Primary Examiner*—Jasmine J Clark
(74) *Attorney, Agent, or Firm*—Fish & Richardson P.C.

(57) ABSTRACT

An adhesive film is formed on an electrode film, and a coating film is formed thereon. Nickel, chrome, molybdenum, tungsten, aluminum or an alloy of them is used as a constituent material of the adhesive film. Gold, silver, platinum or an alloy of them is used as a constituent material of the coating film.

13 Claims, 7 Drawing Sheets

SEMICONDUCTOR DEVICE CONTAINING STACKED SEMICONDUCTOR CHIPS AND MANUFACTURING METHOD THEREOF

BACKGROUND OF THE INVENTION

1. Field of the Invention

This invention relates to a semiconductor device provided with semiconductor chips, and a manufacturing method thereof.

2. Description of the Related Art

Portable electronics devices such as a cellular phone, a PDA, a DVC and a DSC become increasingly sophisticated. The fabrication of the devices with a compact size and lightweight are indispensable so that such devices are accepted in the market. System LSI higher integrated is required for the realization of such devices. On the other hand, LSI used for the devices is required to be with a high functionality and a high performance for the realization of friendly and convenient electronics devices. For this reason, while the number of I/O is. increasing with the acceleration of LSI chip integration, downsizing of the package is also required. The development of the packages appropriate to the board assembly of semiconductor components with a high density is strongly desired to satisfy both of the integration and the downsizing. Some kinds of package technique called CSP (Chip Size Package) are developed to correspond with such demand.

BGA (Ball Grid Array) is known as an example of such a package as described above. BGA is formed by mounting a semiconductor chip on a substrate for the package, molding it by resin, and forming solder balls in an array on the backside surface of the substrate as an external terminal. Since the mounting part of BGA has an area, the downsizing of the package becomes easy. Furthermore, a circuit board corresponding to a narrow pitch, and a mounting technique with a high precision become unnecessary. Therefore, a total mounting cost can be reduced by using BGA even when a packaging cost is relatively high.

FIG. 1 is a schematic illustration of such a standard configuration of BGA as disclosed in Japanese Laid-Open Patent Application H7-183426. BGA 100 has a configuration in which the LSI chip 102 is mounted on the adhesion layer 108 formed on the glass epoxy board 106. The LSI chip 102 is molded by mold resin. The LSI chip 102 is electrically connected with the glass epoxy board 106 by the metal wire 104. The solder balls 112 are formed in an array arrangement on the backside surface of the glass epoxy board 106. BGA 100 is mounted on a printed circuit board by the intermediary of the solder balls 112.

In such a package, a semiconductor chip is connected with a interconnect layer by a wire bonding method or a flip chip method. That is, a pad electrode consisting of a metal film is provided on the top of a interconnect layer, and the pad electrode is connected with a pad electrode of a semiconductor chip by a predetermined conductive member such as a gold wire and solder. It becomes important technical problems to reduce the resistance at the connecting point and to improve the connection strength stably, to improve a yield rate and element reliability.

Related Art List
  JPA laid open H7-183426

SUMMARY OF THE INVENTION

The resistance and the connection strength at the connecting point are not obtained enough in some package formation processes. The inventors of the present invention recognized that defects frequently arose in wire bonding and so on, in particular when a process including plasma treatment is introduced for the formation of elements on an interconnect layer.

The present invention is achieved in view of the aforementioned circumstances and an object thereof is to provide a technique capable of suppressing bad connection between a semiconductor chip and an interconnect layer so that element reliability and a yield rate are improved.

The inventors of the present invention investigated earnestly the reason for inducing the bad connection between a semiconductor chip and an interconnect layer. As a result, they found that the surface property of pad electrodes was changed so that the connection strength declines, when a process such as a plasma treatment, which changes a property of metal surface, is implemented in an element mounting process on the interconnect layer. The present invention is achieved based on such knowledge.

A semiconductor device according to one aspect of the present invention includes: a base material; a conductor circuit provided in the base material; a dielectric film covering at least a part of the base material; a pad electrode provided on a surface of the base material or a surface of the dielectric film and connected with the conductor circuit; a semiconductor chip formed on the dielectric film, and a conductive member electrically connecting the pad electrode and the semiconductor chip, wherein the pad electrode includes a electrode film and a conductive protective film formed on a surface of the electrode film, and the conductive member is formed so that one end thereof contacts with the conductive protective film.

A manufacturing method of a semiconductor device according to one aspect of the present invention includes: providing a base material including a conductor circuit; with forming a dielectric film covering at least a part of the base material, forming a pad electrode, which is connected with the conductor circuit, on a surface of the base material or a surface of the dielectric film; and performing plasma treatment of exposed surfaces of the dielectric film and the pad electrode.

According to the present invention, degradation of surface of pad electrodes can be suppressed since a conductive protective film is provided on the surface of the pad electrodes.

This semiconductor device may have a construction in which the surface of the dielectric film is a plasma treatment surface, and the surface of the conductive protective film includes a plasma-resistant material. The dielectric film may have a cluster of micro projections formed on the surface thereof by the plasma treatment. Although the plasma treatment of the surface of the dielectric film leads to the improvement of adhesion for a film formed thereon, degradation of the surface of the pad electrode simultaneously arises, and the bad connection between the semiconductor chip and the interconnect layer becomes a problem. According to the construction described above, such a problem can be solved since the degradation of the surface of the pad electrode can be suppressed by the conductive protective film.

The semiconductor device may have a construction in which the dielectric film has a concave part, the pad electrode is formed inside the concave part, and a void part is provided between the inside wall of the concave part and the side wall of the pad electrode. With this construction, the adhesion for the film, such as mold resin, formed on the dielectric film can be improved. Furthermore, the surface of the pad electrode becomes less subject to the attachment of particles of the dielectric film material.

The conductive protective film according to the present invention may include an adhesive film formed on the electrode film, and a coating film formed on the adhesive film, which constitutes the surface of the conductive protective film.

This summary of the invention does not necessarily describe all necessary features so that the invention may also be a sub-combination of these described features.

DETAILED DESCRIPTION OF THE INVENTION

Although the invention will be described below based on the preferred embodiments, the ISB™ configuration introduced in each embodiment will be now described prior to it. ISB™ (Integrated System in Board) is a unique package developed by the inventors of the present invention. ISB™ is a unique coreless system-in package in the packaging techniques involving electric circuits including semiconductor bare chips mainly, and it has interconnect patterns made of copper but no core (base material) to support circuit components.

Figure 1:
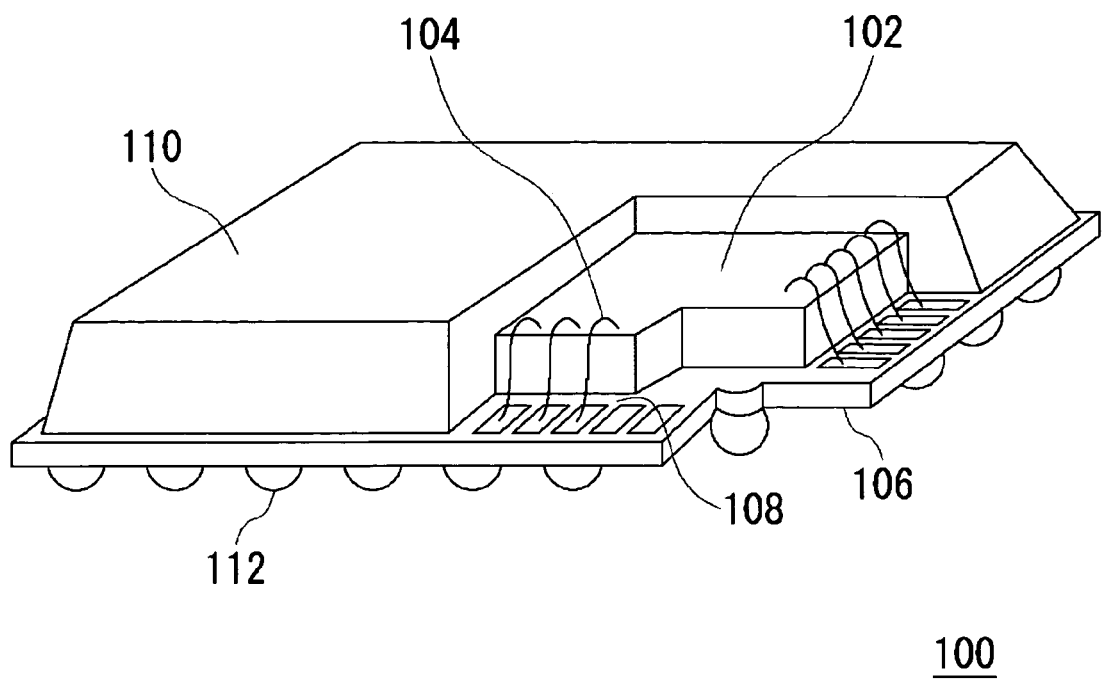
FIG. 1 shows a package configuration according to a prior art.
Figure 2:
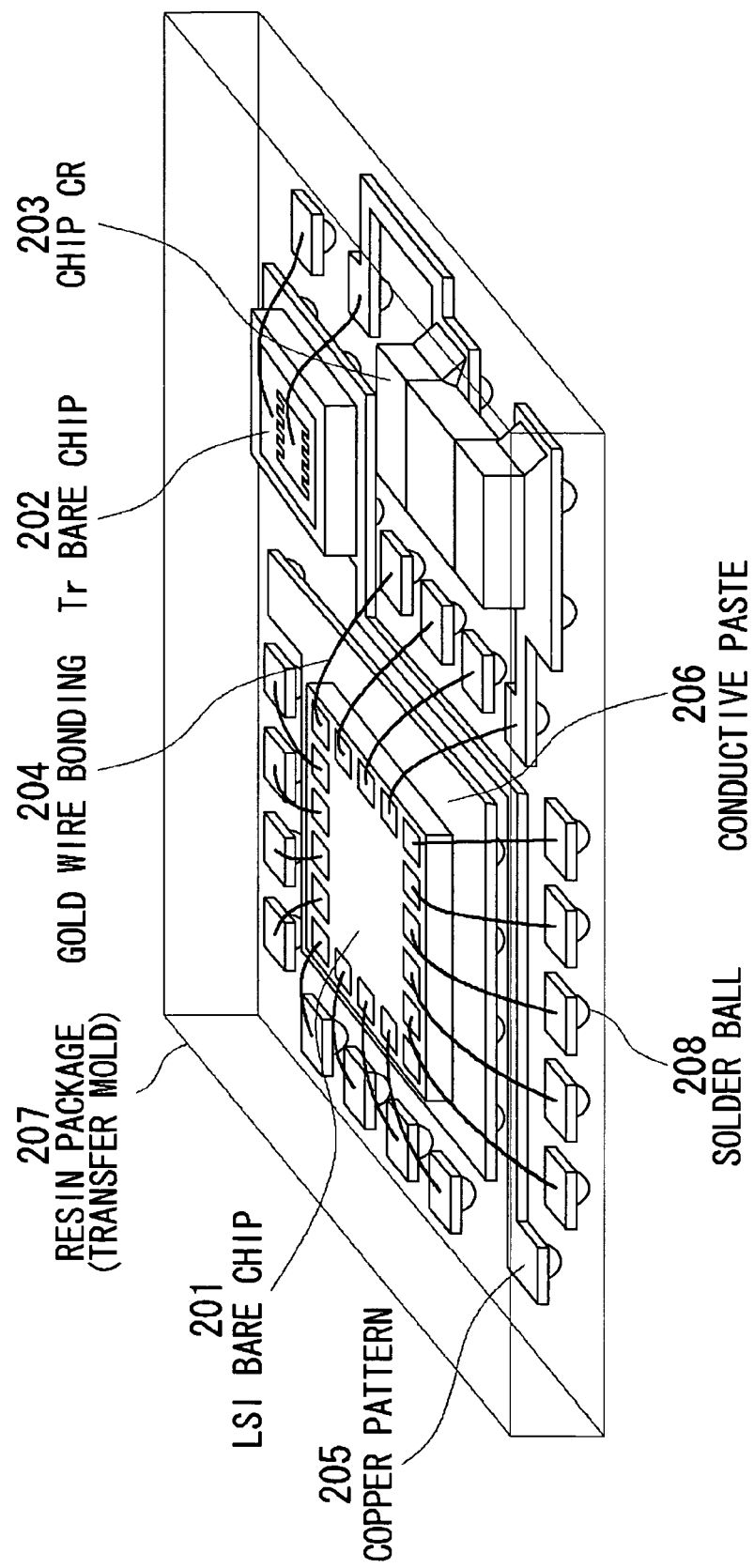
FIG. 2 shows a configuration of ISBTM.

FIG. 2 shows a schematic illustration of an example of ISB™. Although a single interconnect layer is shown for a simple explanation of the overall configuration of ISB™, the configuration practically includes a plurality of interconnect layers stacked. This ISB™ has a configuration that includes the LSI bare chip 201, Tr bare chip 202 and the chip CR 203 connected by interconnect lines that include the copper pattern 205. The LSI bare chip 201 is connected with extraction electrodes and the interconnect lines by the gold wire bonding 204. The ISB™ is mounted on a printed circuit board by the conductive paste 206 formed beneath the LSI bare chip 201. ISB™ is entirely sealed with a resin package 207 made of epoxy resin and so on. Although the configuration that includes a single interconnect layer is shown in this figure, a multilayer interconnect configuration may be also adopted.

Figure 3A:
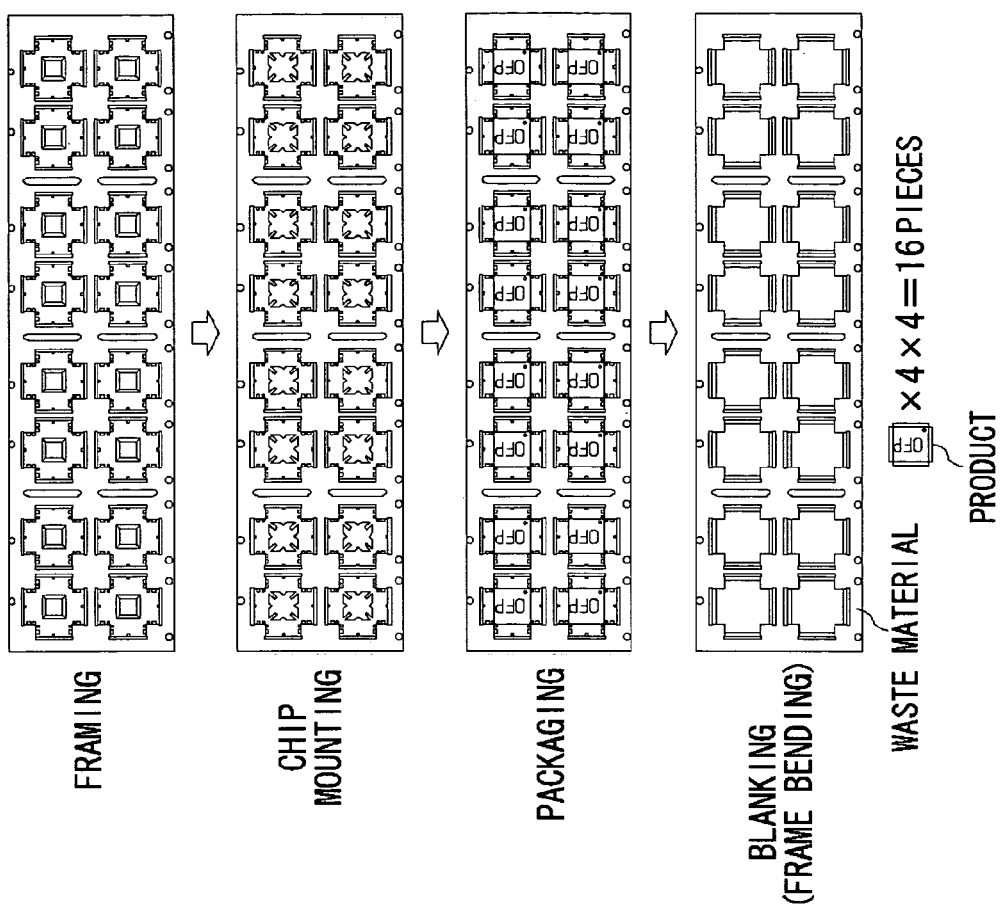
FIG. 3A shows manufacturing process of BGA.
Figure 3B:
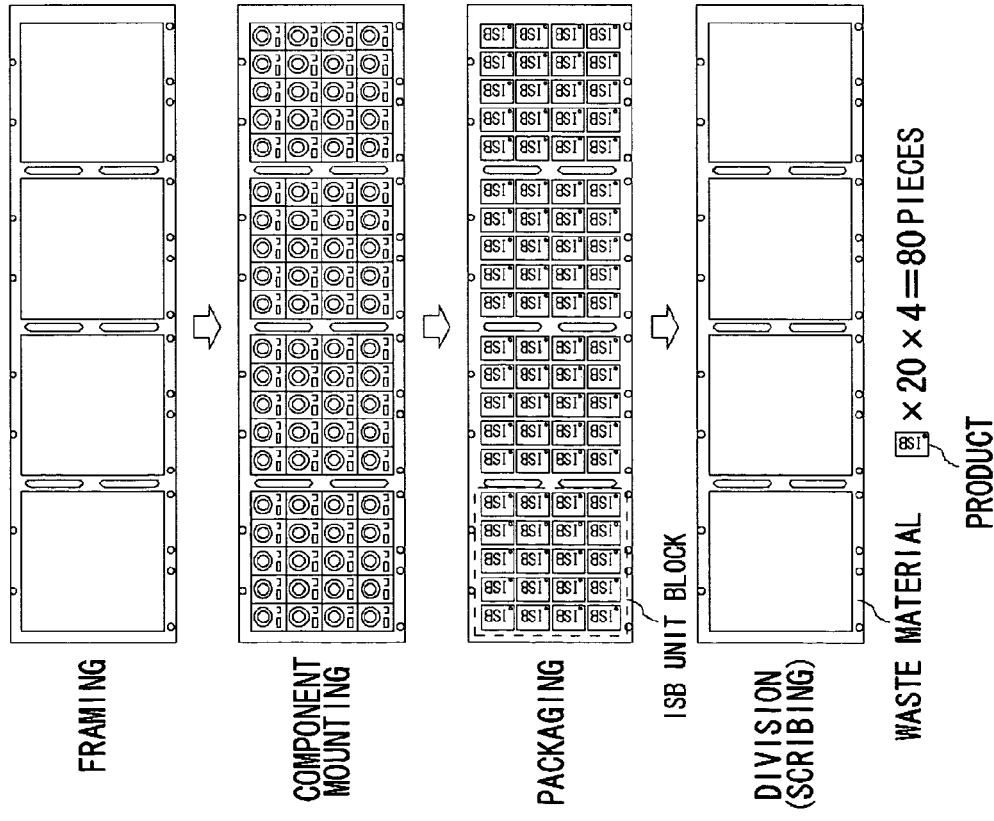
FIG. 3B shows manufacturing process of ISBTM.

FIGS. 3A and 3B show a comparison of manufacturing processes of a conventional CSP and the ISB™ according to one aspect of the present invention. FIG. 3A shows a manufacturing process of the conventional CSP. A frame is firstly formed on a base substrate, and chips are mounted on the element formation areas segmented by the frame. After that, a package made of thermosetting resin is provided for each element, and blanking is performed for each element by using a metal die. In the final blanking process, the mold resin and the base substrate are cut simultaneously. Therefore, the roughness of the cut surface becomes a problem. Furthermore, since a large amount of waste material after the blanking process generates, a problem also arises from the viewpoint of environmental burden.

FIG. 3B shows the ISB™ manufacturing process. Frames are firstly formed on a metal foil. Circuit elements such as a LSI are mounted on interconnect patterns formed in each module formation area. After packaging each module, finished products are obtained by dicing along scribing areas. Since the metal foil as a base is removed after the packaging process and before the scribing process, only the resin layer is cut by dicing in the scribing process. Therefore, the roughness of the cut surface can be prevented, and the dicing can be performed more accurately.

The following advantages are obtained by the technique of ISB™.

(i) Transistors, ICs and LSIs can be made smaller and thinner because of the coreless assembly.

(ii) High-performance SIP (System-in Package) can be realized since a circuit including transistors, system LSIs, chip capacitors and chip resistors can be formed and packaged.

(iii) It becomes possible to develop a system LSI in a short term since existing semiconductor chips can be used in combination.

(iv) High rate of heat radiation can be obtained since the semiconductor bare chip is directly mounted on copper.

(v) Since the interconnect material is copper and there is no core material, the circuit interconnect has a low dielectric constant so that the excellent properties in high-speed transfer of data and in a high-frequency circuit can be obtained.

(vi) The formation of particle contamination of the electrode material can be suppressed because of the configuration where the electrodes are embedded in the package.

(vii) Environmental burden can be reduced since the package size is free, and the amount of the waste material per one package is one-tenth of that of SQEP package having 64 pins.

(viii) The concept of a system construction can be changed from a printed circuit board to mount components into a functional circuit board.

(ix) The design of ISP patterns is as easy as the design of printed circuit board patterns, and can be performed by engineers themselves in set manufacturers.

Next, the preferred embodiments of the present invention will be explained referring to figures.

Figure 4:
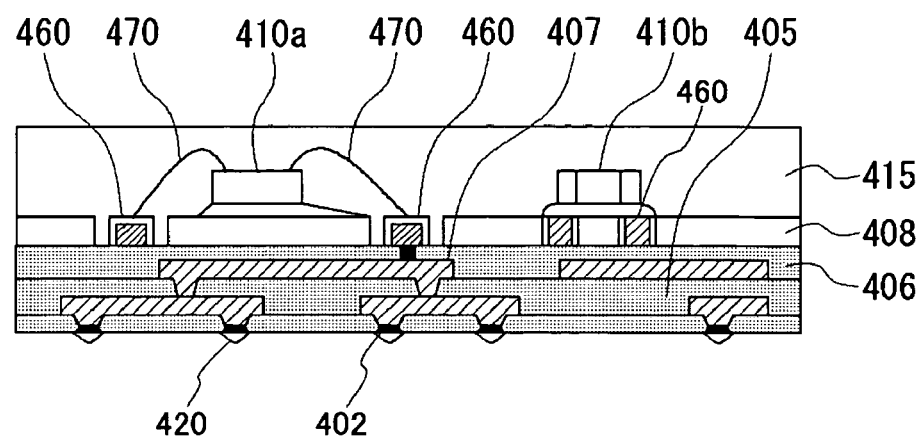
FIG. 4 shows a configuration of a semiconductor device according to the embodiment.

A semiconductor device having an ISB™ configuration described above will be taken as an example for a following explanation of the preferred embodiment of the present invention. FIG. 4 shows a cross sectional view of a semiconductor device according to the present embodiment. This semiconductor device includes a multilevel interconnect configuration, and the element 410a and the circuit element 410b that are formed on the multilevel interconnect configuration. The multilevel interconnect configuration includes a plurality of interconnect layers stacked, each of which consists of the interlayer dielectric film 405 or 406 and the interconnect line 407 made of copper, and the solder resist layer 408 formed as the top layer. The solder ball 420 is provided on the backside surface of the multilevel interconnect configuration. The element 410a and the circuit element 410b are molded by the mold resin 415.

The pad electrode 460 is electrically connected to the interconnect line 407. The pad electrode 460 and the element 410a are connected by the gold wire 470. The pad electrode 460 and the element 410b are connected by a flip chip method. The pad electrode 460 includes a copper film and a plasma-resistant protective film, which is made of a conductive material, formed on the copper film. The configuration of the plasma-resistant protective film will be described below.

The resin materials such as a melamine derivative such as BT resin, a liquid crystal polymer, an epoxy resin, a PPE resin, a polyimide resin, a fluorocarbon resin, a phenol resin and a thermosetting resin such as a polyamide bismaleimide can be selected for the solder resist layer 408, the interlayer dielectric film 405 and the mold resin 415 in FIG. 4, respectively. In particular, the liquid crystal polymer, the epoxy resin and the melamine derivative such as BT resin are preferably used since they have an excellent high-frequency property. Filler or additive may be arbitrarily added to the resin.

Figure 5A:
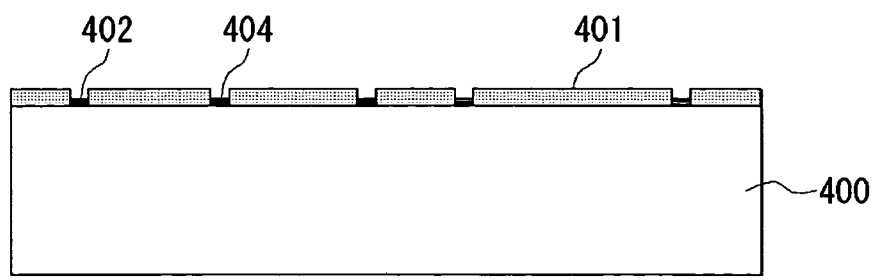
FIG. 5A shows a manufacturing process of a semiconductor device according to the embodiment.

Next, a manufacturing method of the semiconductor device shown in FIG. 4 will be described in reference to FIGS. 5A to 7C. The via hole 404 is formed at a predetermined location on the metal foil 400, and the conductive film 402 is formed in the via hole 404 selectively as shown in FIG. 5A. More specifically, after coating the metal foil 400 by the photo resist 401, the conductive film 402 is formed on an exposed part of the surface of the metal foil 400 by an electric field plating method. The conductive film 402 has a thickness of about 1 to 10 µm, for example. Since the conductive film 402 will become finally a backside electrode of a semiconductor device, gold or silver, which has a good adhesiveness for brazing filler metal such as solder, is preferably used for the conductive film 402.

Figure 5B:
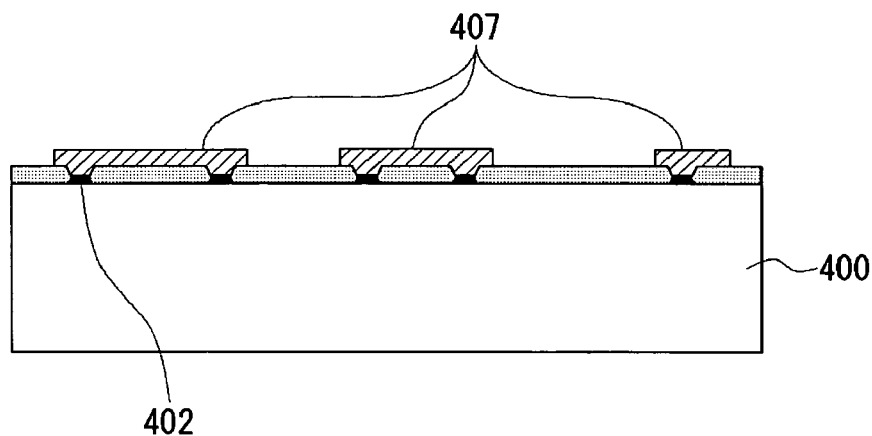
FIG. 5B shows a manufacturing process of a semiconductor device according to the embodiment.

After that, the interconnect pattern of the first layer are formed on the metal foil 400 as shown in FIG. 5B. First, chemical polishing is performed against the metal foil 400 for cleaning the surface and to form a rough surface. Next, the conductive film 402 on the metal foil 400 is entirely coated by thermosetting resin, and heat hardening is performed so that the film surface becomes flat. Next, a via hole with a diameter of about 100 µm reaching to the conductive film 402 is formed in the film. The via hole is formed by a laser processing in the present embodiment. Machining, chemical etching, and dry etching by using plasma can be also used to form the via hole. After that, etching residue is removed by laser exposure, and a copper plating layer is formed on overall the surface with embedding the via hole 404. The copper plating layer is etched by using a photo resist mask so that the interconnect line 407 made of copper is formed. The interconnect pattern can be formed by removing unnecessary copper foil by spraying etching solution to the surface exposed out of the resist, for example.

Figure 5C:
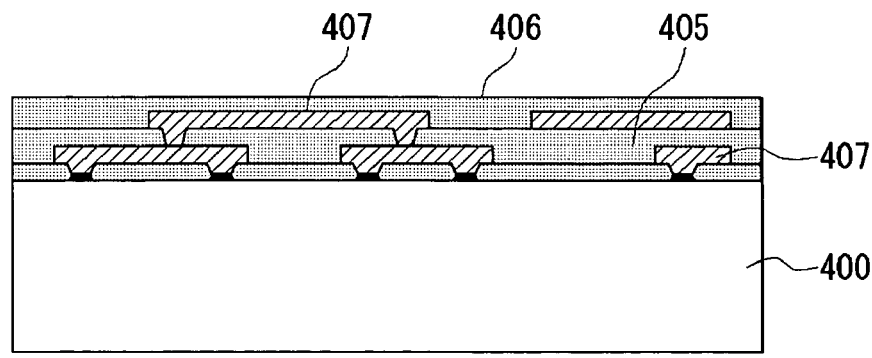
FIG. 5C shows a manufacturing process of a semiconductor device according to the embodiment.

The formation of the interlayer dielectric film 405, the via hole and the copper plating layer, and the patterning of the copper plating layer mentioned above are repeated in turn so that the multilevel interconnect configuration in which the interconnect layers including the interconnect line 407 and the interlayer dielectric films 405 and 406 are stacked is formed as shown in FIG. 5C.

After the formation of the pad electrodes 460 and the solder resist layer 408 that has openings at the locations of the pad electrodes 460, the element 410a and the circuit element 410b are formed on the solder resist layer 408. A dielectric material that has a good solder heat resistance is used for the solder resist layer 408. For example, an epoxy resin may be used. The element 410a and the circuit element 410b may be, for example, semiconductor chips such as a transistor, a diode and an IC chip, or passive elements such as a chip capacitor and a chip resistor. Face-down semiconductor elements such as a CSP and a BGA may be also mounted. In the present embodiment, the element 410a is a bare semiconductor chip (a transistor chip) and the circuit element 410b is a chip capacitor. These elements are stuck on the solder resist layer 408.

Figure 6A:
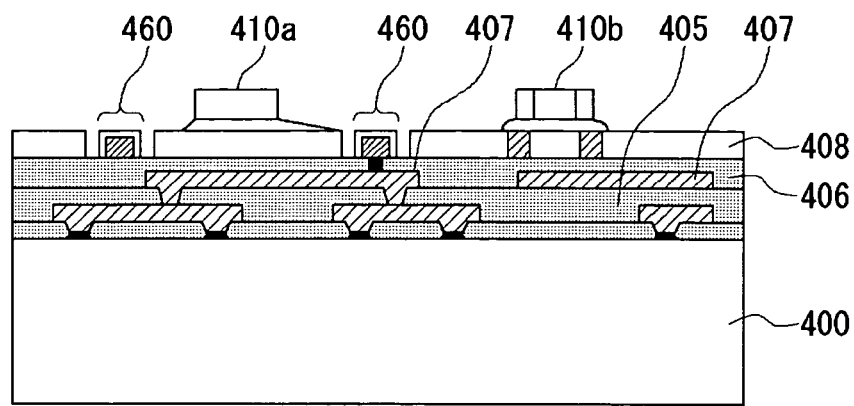
FIG. 6A shows a manufacturing process of a semiconductor device according to the embodiment.
Figure 7A:
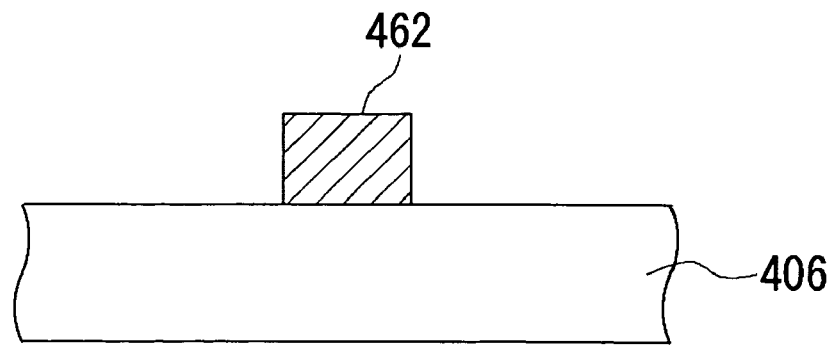
FIG. 7A shows a manufacturing process of a semiconductor device according to the embodiment.
Figure 7B:
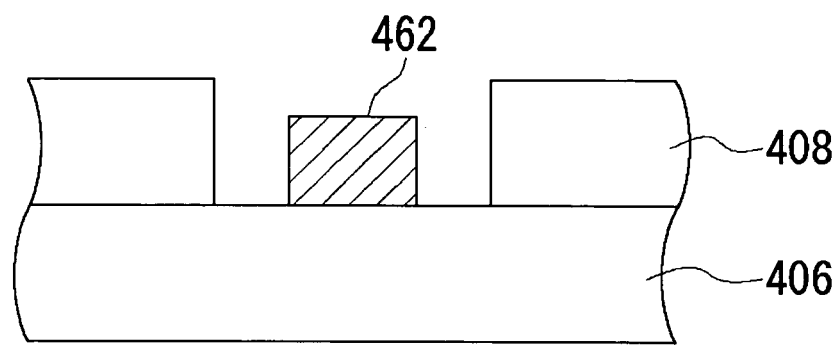
FIG. 7B shows a manufacturing process of a semiconductor device according to the embodiment.
Figure 7C:
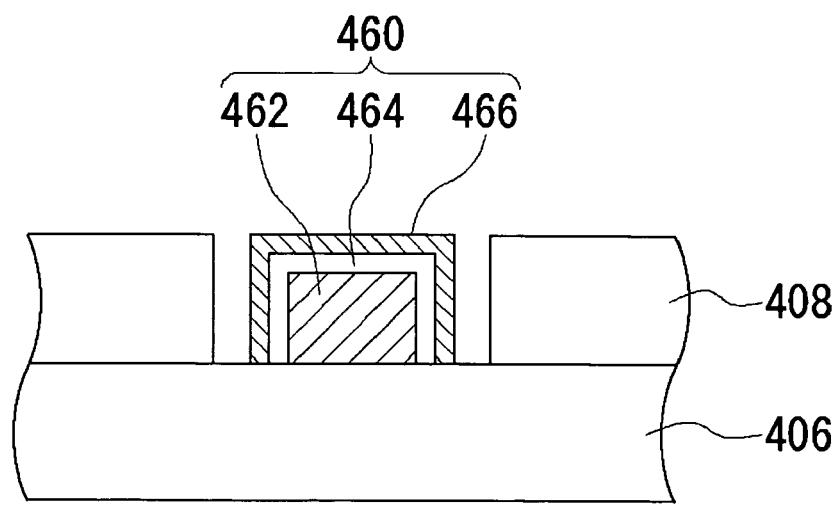
FIG. 7C shows a manufacturing process of a semiconductor device according to the embodiment.

The formation process of the configuration shown in FIG. 6A is now described referring to FIG. 7. After formation of a copper film on the interlayer dielectric film 406, the electrode film 462 is formed by patterning processes. After that, the adhesive film 464 is formed on the surface of the electrode film 462 by a selective plating method, followed by forming the coating film 466. Nickel, chrome, molybdenum, tungsten, aluminum or an alloy of them is, for example, used for the adhesive film 464. Gold, silver, platinum or an alloy of them is, for example, used for the coating film 466. Each of the films may have either a single layer or a double layer. Next, the solder resist layer 408 is formed by thermocompression of a solder resist sheet stuck on the surface of the interlayer dielectric film 406. Opening is formed at the location of the electrode film 462 in the solder resist layer 408 by exposure and development. A void part is provided between the side wall of the electrode film 462 and the inside wall of the opening in the solder resist layer 408. Although the solder resist layer 408 made of an epoxy resin is formed by using an epoxy resin sheet in the present embodiment, other kinds of material may be used.

When the electrode film 462 is made of copper or copper-aluminum alloy, nickel and gold are, for example, preferably used for the adhesive film 464 and the coating film 466, respectively. This combination is adopted in the present embodiment.

The pad electrode 460 with a plasma-resistant protective film, in which the adhesive film 464 and the coating film 466 are stacked on the electrode film 462 in this order, is formed as mentioned above. In this configuration, the coating film 466 contributes to improvement of plasma-resistance, and the adhesive film 464 contributes to improvement of the adhesion between the coating film 466 and the electrode film 462. The configuration shown in FIG. 6A can be obtained as described above.

Plasma treatment is performed for the configuration shown in FIG. 6A. The plasma exposure condition may be arbitrarily determined corresponding to used resin so that a cluster of micro projections mentioned above is formed. A bias voltage is preferably not applied to the substrate. For example, the following condition is adopted.

Bias voltage: no voltage applied

Plasma gas: argon of 10 to 20 sccm and oxygen of 0 to 10 sccm

By the plasma exposure, the surface of the interconnect line 407 is cleaned, the surface property of the solder resist layer 408 is modified, and a cluster of micro projections is formed on the surface. The cluster of micro projections formed on the surface of the solder resist layer 408 and the surface of the elements 410a and 410b have an average diameter of 1 to 10 nm and a number density of about $1 \times 10^3$ $\mu m^{-2}$.

Figure 6B:
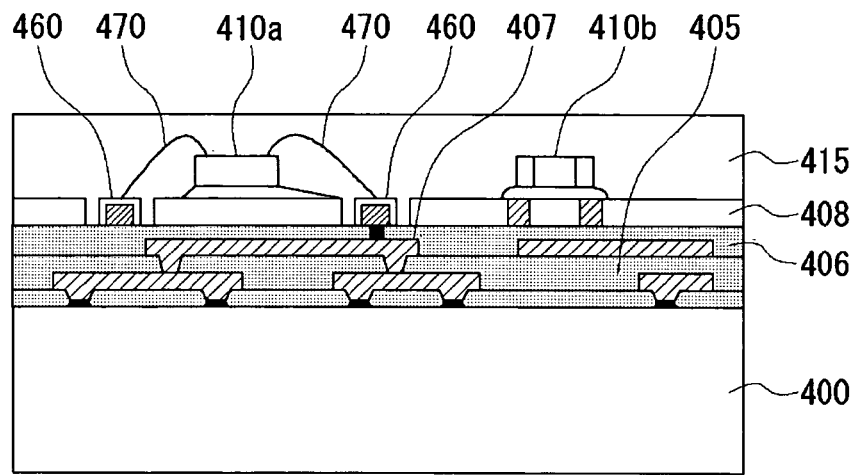
FIG. 6B shows a manufacturing process of a semiconductor device according to the embodiment.

After connecting the element 410a and the pad electrode 460 by the gold wire 470, they are molded by the mold resin 415 as shown in FIG. 6B. FIG. 6B shows a molded configuration. The mold process of semiconductor elements is performed simultaneously for a plurality of modules mounted on the metal foil 400 by using a mold. Transfer mold, injection mold, potting and dipping may be used for the mold process. When a thermosetting resin such as an epoxy resin is used, the transfer mold or potting can be adopted. When a thermoplastic resin such as a polyimide resin and a polyphenylene sulfide is used, the injection mold can be adopted.

After removing the metal foil 400 from the configuration shown in FIG. 6B, solder balls are formed on the backside surface. The metal foil 400 can be removed by polishing, grinding, etching or laser vaporization, for example. The method adopted in the present embodiment is as follows: the metal foil 400 is overall grinded about 50 pm by a polisher or a grinder, and the rest of the metal foil 400 is removed by chemical wet etching. Wet etching may be used also for removing the entire metal foil 400. By these processes, the lower surface of the interconnect line 407 in the first layer is exposed on the opposite side of the surface where the semiconductor elements are mounted. With this configuration, a module having a flat underside surface is obtained in the present embodiment. Therefore, when the semiconductor device is mounted, it moves horizontally by surface tension of solder and so on, and an advantage in the processing, i.e., easy self alignment, can be obtained.

After that, the solder ball 420 is formed by sticking a conductive material such as solder on the backside surface of the conductive film 402, which is exposed by removing the metal foil 400. Then the semiconductor device shown in FIG. 4 is obtained by dicing. The wafer is subsequently cut by dicing so that a chip of the semiconductor device can be obtained. The metal foil 400 is a supporting substrate before removing the metal foil 400 as described above. The metal foil 400 is also used as an electrode in the electric field plating process to form the interconnect line 407. Furthermore, also when the mold resin 415 is molded, the metal foil 400 makes the workability of carrying to a mold and of mounting in the mold favorable.

In the semiconductor according to the present embodiment, the property of surfaces of the solder resist layer 408, the element 410a and the circuit element 410b is modified by Ar plasma treatment in the process shown in FIG. 6A, and micro projections are formed thereon. As a result, the interface adhesiveness between them and the mold resin 415 is significantly improved, and the yield rate and the element reliability are advanced.

Moreover, a bad connection between a semiconductor chip and an interconnect layer can be suppressed in the wire bonding process since the surface of the pad electrode 460 does not degrade even if such a plasma treatment as described above is performed. Therefore, high reliability and a high yield rate can be realized.

Although the present invention has been described by way of exemplary embodiments, it should be understood that many changes and substitutions may be made by those skilled in the art without departing from the spirit and the scope of the present invention which is defined only by the appended claims.

What is claimed is:

1. A semiconductor device comprising:
   a base material;
   a conductor circuit in the base material;
   a dielectric film covering at least part of the base material;
   a pad electrode on a surface of the base material or a surface of the dielectric film and connected with the conductor circuit;
   a semiconductor chip on the dielectric film;
   a conductive member electrically connecting the pad electrode and the semiconductor chip,
   wherein the pad electrode comprises an electrode film and a conductive protective film on a surface of the electrode film,
   wherein one end of the conductive member contacts the conductive protective film and
   wherein the surface of the dielectric film is a plasma treated surface, and the surface of the conductive protective film comprises a plasma-resistant material.

2. The semiconductor device of claim 1, wherein the conductive protective film comprises an adhesive film formed on the electrode film, and a coating film formed on the adhesive film, which constitutes the surface of the conductive protective film.

3. A semiconductor device comprising:
   a base material;
   a conductor circuit provided in the base material;
   a dielectric film covering at least a part of the base material;
   a pad electrode provided on a surface of the base material or a surface of the dielectric film and connected with the conductor circuit;
   a semiconductor chip formed on the dielectric film; and
   a conductive member electrically connecting the pad electrode and the semiconductor chip, wherein the pad electrode comprises an electrode film and a conductive protective film formed on a surface of the electrode film, the conductive member is formed so that one end thereof contacts with the conductive protective film, and a cluster of micro projections is formed on the surface of the dielectric film.

4. The semiconductor device of claim 1, wherein a cluster of micro projections is formed on the surface of the dielectric film.

5. The semiconductor device of claim 3, wherein the conductive protective film comprises an adhesive film formed on the electrode film, and a coating film formed on the adhesive film, which constitutes the surface of the conductive protective film.

6. The semiconductor device of claim 3, wherein the surface of the dielectric film is a plasma treated surface and the surface of the conductive protective film comprises a plasma-resistant material.

7. The semiconductor device of claim 3, wherein the dielectric film has a concave part, the pad electrode is formed inside the concave part, and there is a gap between the inside wall of the concave part and the side wall of the pad electrode.

8. A semiconductor device comprising:
   a base material;
   a conductor circuit provided in the base material;
   a dielectric film covering at least a part of the base material;
   a pad electrode provided on a surface of the base material or a surface of the dielectric film and connected with the conductor circuit;
   a semiconductor chip formed on the dielectric film; and
   a conductive member electrically connecting the pad electrode and the semiconductor chip, wherein the pad electrode comprises an electrode film and a conductive protective film formed on a surface of the electrode film, the conductive member is formed so that one end thereof contacts with the conductive protective film, and the conductive protective film comprises an adhesive film formed on the electrode film, and a coating film formed on the adhesive film, which constitutes the surface of the conductive protective film.

9. The semiconductor device of claim 8, wherein the surface of the dielectric film is a plasma treated surface and the surface of the conductive protective film comprises a plasma-resistant material.

10. The semiconductor device of claim 8, wherein the dielectric film has a concave part, the pad electrode is formed inside the concave part, and there is a gap between the inside wall of the concave part and the side wall of the pad electrode.

11. The semiconductor device of claim 8, wherein a cluster of micro projections is formed on the surface of the dielectric film.

12. The semiconductor device of claim 8, wherein the adhesive film is selected from a group consisting of Ni, Cr, Mo, W and Al.

13. The semiconductor device of claim 8, wherein the coating film is selected from a group consisting of Au, Ag and Pt.

* * * * *